(12) United States Patent
Chai et al.

(10) Patent No.: US 6,555,924 B2
(45) Date of Patent: Apr. 29, 2003

(54) SEMICONDUCTOR PACKAGE WITH FLASH PREVENTING MECHANISM AND FABRICATION METHOD THEREOF

(75) Inventors: Ting Ke Chai, Taichung (TW); Po Hauu Yuan, Taichung (TW); Han Ping Pu, Taipei Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/932,054

(22) Filed: Aug. 18, 2001

(65) Prior Publication Data

US 2003/0034568 A1 Feb. 20, 2003

(51) Int. Cl.⁷ ............................................... H01L 23/29
(52) U.S. Cl. .................. 257/788; 257/667; 257/787; 257/737; 257/738; 257/687; 438/784; 438/112; 438/124; 438/126; 438/127; 264/272.17
(58) Field of Search ................................. 257/667, 788, 257/795, 678, 687, 787, 738, 778, 734, 692, 693, 784, 737; 438/112, 124, 126, 127; 264/272.17

(56) References Cited

U.S. PATENT DOCUMENTS

| | | | | |
|---|---|---|---|---|
| 5,450,283 A | * | 9/1995 | Lin et al. | 174/16.3 |
| 5,535,101 A | | 7/1996 | Miles et al. | |
| 5,672,912 A | * | 9/1997 | Aoki et al. | 257/693 |
| 5,844,309 A | * | 12/1998 | Takigawa et al. | 257/701 |
| 6,038,136 A | | 3/2000 | Weber | |
| 6,104,095 A | * | 8/2000 | Shin et al. | 257/667 |
| 6,246,115 B1 | * | 6/2001 | Tang et al. | 257/675 |
| 6,319,450 B1 | * | 11/2001 | Chua et al. | 257/787 |
| 6,329,606 B1 | * | 12/2001 | Freyman et al. | 174/260 |
| 6,369,455 B1 | * | 4/2002 | Ho et al. | 257/730 |
| 6,407,461 B1 | * | 6/2002 | Farquhar et al. | 257/667 |
| 2002/0003308 A1 | * | 1/2002 | Kim et al. | 257/778 |

* cited by examiner

*Primary Examiner*—Nathan J. Flynn
*Assistant Examiner*—Pershelle Greene
(74) *Attorney, Agent, or Firm*—Peter F. Corless; Steven M. Jensen; Edwards & Angell, LLP

(57) ABSTRACT

A semiconductor package and a fabricating method thereof are proposed, in which a substrate is prepared for having at least one flash preventing mechanism disposed on a surface of the substrate corresponding to a position in front of an entry of an air vent in a mold. After a semiconductor chip is mounted on the substrate by a plurality of conductive elements, a molding compound having high fluidity and fine filler particles is used to encapsulate the chip and the flash preventing mechanism. As the flash preventing mechanism is disposed in a manner of reducing the entry space of the air vent, the flow of the molding compound is impeded by the flash preventing mechanism, making the molding compound rapidly absorb heat of the mold and accordingly increased in viscosity. This helps prevent flash of the molding compound from occurrence, and assure the semiconductor package in quality and profile.

16 Claims, 10 Drawing Sheets

SEMICONDUCTOR PACKAGE WITH FLASH PREVENTING MECHANISM AND FABRICATION METHOD THEREOF

FIELD OF THE INVENTION

The present invention relates to semiconductor packages and fabricating methods thereof, and more particularly, to a semiconductor package having a semiconductor chip mounted on a substrate and a fabricating method thereof

BACKGROUND OF INVENTION

A conventional BGA (ball grid array) semiconductor package employs an advanced technology, in which a substrate has a front side for disposing a semiconductor chip thereon and a back side for implanting a plurality of solder balls, so as to provide high density of I/O connections for electrically connecting the semiconductor package to an external printed circuit board.

A FCBGA (flip-chip ball grid array) semiconductor package is more improved than the conventional BGA semiconductor package, in that a semiconductor chip is mounted in the FCBGA semiconductor package in an upside-down manner that the chip has an upper side downwardly reflowed to a front side of a substrate by a plurality of solder bumps, while on a back side of the substrate there are implanted a plurality of solder balls for electrically connecting the semiconductor package to an external device, and accordingly the semiconductor package can be miniaturized in profile.

However, the solder bumps for mounting the chip on the substrate are disposed in a manner that a cavity is formed between the chip and the substrate. If the cavity is not filled with an insulative material, the chip and the substrate tend to be structurally damaged by a thermal stress generated from the difference in coefficient of thermal expansion (CTE) between the chip and the substrate during a temperature cycle in subsequent fabricating processes. Therefore, a flip chip underfill process, which fills the cavity between the chip and the substrate with the insulative material such as epoxy resin, is essential for fabricating the FCBGA semiconductor package, so as to enhance the structural strength for the semiconductor package.

Currently, U.S. Pat. Nos. 5,535,101 "Leadless Integrated Circuit Package" and U.S. Pat. No. 5,218,234 "Semiconductor Device with Controlled Spread Polymeric Underfill" have respectively disclosed a flip chip underfill technology; however, drawbacks have been found for the technology as follows. First, the flip chip underfill technology employs a capillary filling technique, which requires long filling time and tends to cause the formation of voids. Moreover, an ideal material used for filling the cavity between the chip and the substrate is commonly added with a solid filler for making the filling material have a similar CTE to that of the solder bumps, so as to protect the solder bumps from being damaged by a thermal stress. However, the addition of the solid filler significantly increases a viscosity of the filling material, which makes the filling material reduced in fluidity and the filling time further prolonged.

U.S. Pat. No. 6,038,136 discloses a simplified flip chip underfill technology, that is, a molded underfill technology in a molding process. As shown. in FIG. 1, a FCBGA semiconductor package 1 includes a substrate 10 having a front side 100 pre-formed with a chip bonding region 102 thereon for reflowing a semiconductor chip 12 on the chip bonding region 102 in a flip chip manner via a plurality of solder bumps 11; while the substrate 10 has a back side 101 to be covered by a solder mask 16 in a manner that a plurality of solder pads 18 formed on the back side 101 are exposed for implanting a plurality of solder balls (not shown) thereon, and further, a specified molding compound 19 is used for encapsulating the chip 12 and the solder bumps 11. The molding compound 19 is a low viscous epoxy resin containing a solid filler in 70–90%, wherein the solid filler consists of flue particles having small particle diameters within 0.01–0.05 mm such as silicon, quartz, etc.

The foregoing underfill technology is characterized in that the filling for a cavity between the chip 12 and the substrate 10 is implemented in the molding process. As shown in FIG. 2, after a filling material 19 (same as the molding compound 19) is injected into a mold (not shown), excess air can escape through a plurality of air vents 17 connected to the outside for preventing the formation of voids. However, as the filling material 19 having high fluidity and a fine filler with a particle diameter smaller than 20 $\mu$m, and the air vents 17 about 40–50 $\mu$m in height are much higher than the filler's particle diameter, the low viscous filling material 19 can therefore freely leak out of the air vents 17, making the filling material 19 seriously flash around the air vents 17. In addition, the flashing material 19 can further flow through slots 104 at two sides of the substrate 10 to a bottom surface of the semiconductor package 1, making the mold hard to be removed from the semiconductor package 1 due to the stickiness of the flashing material 19; while the solder pads (not shown) formed on the back side 101 of the substrate 10 can also be easily contaminated by the flashing material 19, and accordingly implantation of the solder balls on the solder pads is deteriorated in quality.

SUMMARY OF THE INVENTION

A primary objective of the present invention is to provide a semiconductor package and a fabricating method thereof, in which a flash preventing mechanism is formed at a front end of an air vent, for reducing an entry space of the air vent and accordingly making a molding compound flow slowly into the air vent, so as to help prevent the molding compound from flashing on a surface of a substrate. Moreover, flash of the molding compound can be prevented from occurring on a bottom surface of the semiconductor package in the invention, for allowing a mold to be easily removed after completing a molding process. In addition, the invention allows solder pads formed on the substrate to be free of flash, so as to assure the quality of an implantation process for implanting solder balls on the solder pads.

In accordance with the foregoing and other objectives, the present invention proposes a semiconductor package and a fabricating method thereof, comprising: a substrate having a front side and a back side is prepared, wherein the front side is pre-formed with a chip bonding region, and on the front side around the chip bonding region there are disposed a plurality of flash preventing mechanisms corresponding in position to entries of air vents in a mold; a semiconductor chip is mounted on the chip bonding region and electrically connected to the substrate; and an encapsulant is formed of a molding compound with high fluidity for encapsulating the chip and the flash preventing mechanisms, so that the fabrication for the semiconductor package is completed.

As the flash preventing mechanisms are disposed on the substrate corresponding in position to the entries of the air vents, in a molding process, flow of a molding compound can be impeded by the flash preventing mechanisms at the air vent entries for reducing the flow rate of the molding compound. Further, the flash preventing mechanisms occupy part of the entry spaces at the air vents, making the slower flowing molding compound able to rapid absorb heat from the mold and accordingly increase in viscosity, so as to effectively prevent flash of the molding compound from occurrence.

BRIEF DESCRIPTION OF THE DRAWINGS

The present invention can be more fully understood by reading the following detailed description of the preferred embodiments, with reference made to the accompanying drawings wherein.

DETAILED DESCRIPTION OF THE PREFERRED EMBODIMENT

First Preferred Embodiment

In the first embodiment, a FCBGA semiconductor package is exemplified for depicting in detail a molded underfill technology used in the semiconductor package of the invention.

Figure 1:
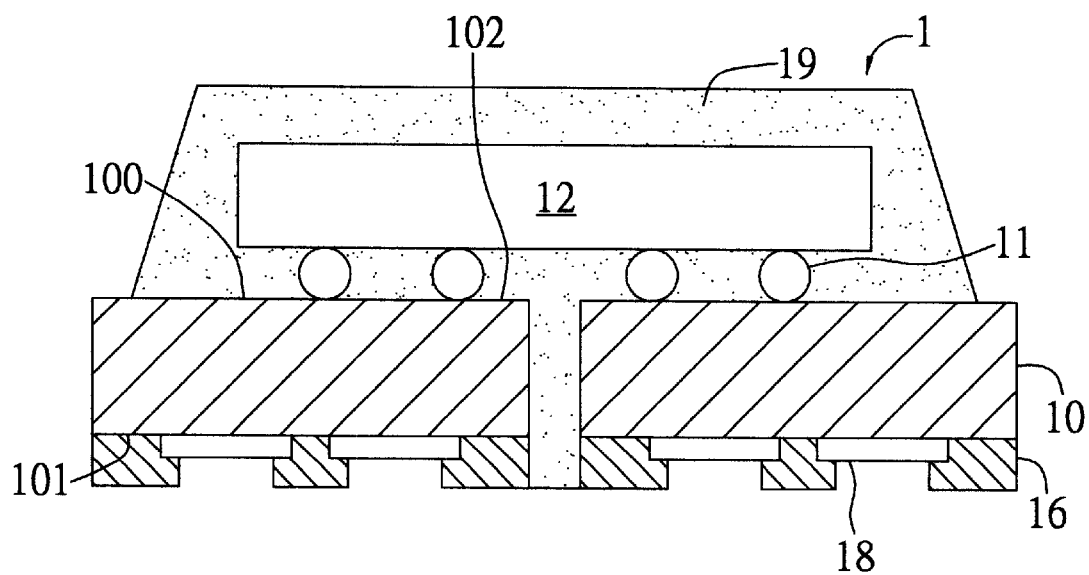
FIG. 1 (PRIOR ART) is a sectional view of a FCBGA semiconductor package in the use of a molded underfill technology disclosed in U.S. Pat. No. 6,038,136.
Figure 2:
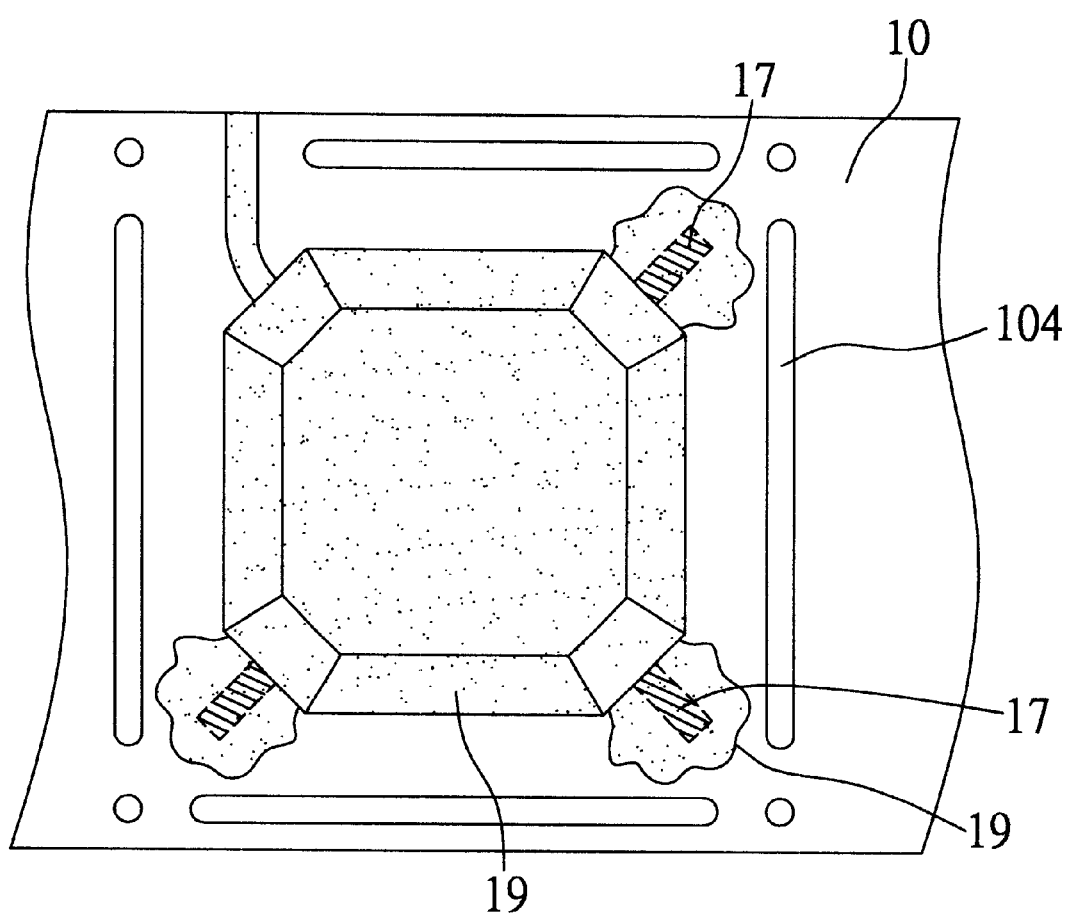
FIG. 2 (PRIOR ART) is a top view showing flash of a molding compound in a molding process of FIG. 1.
Figure 3A:
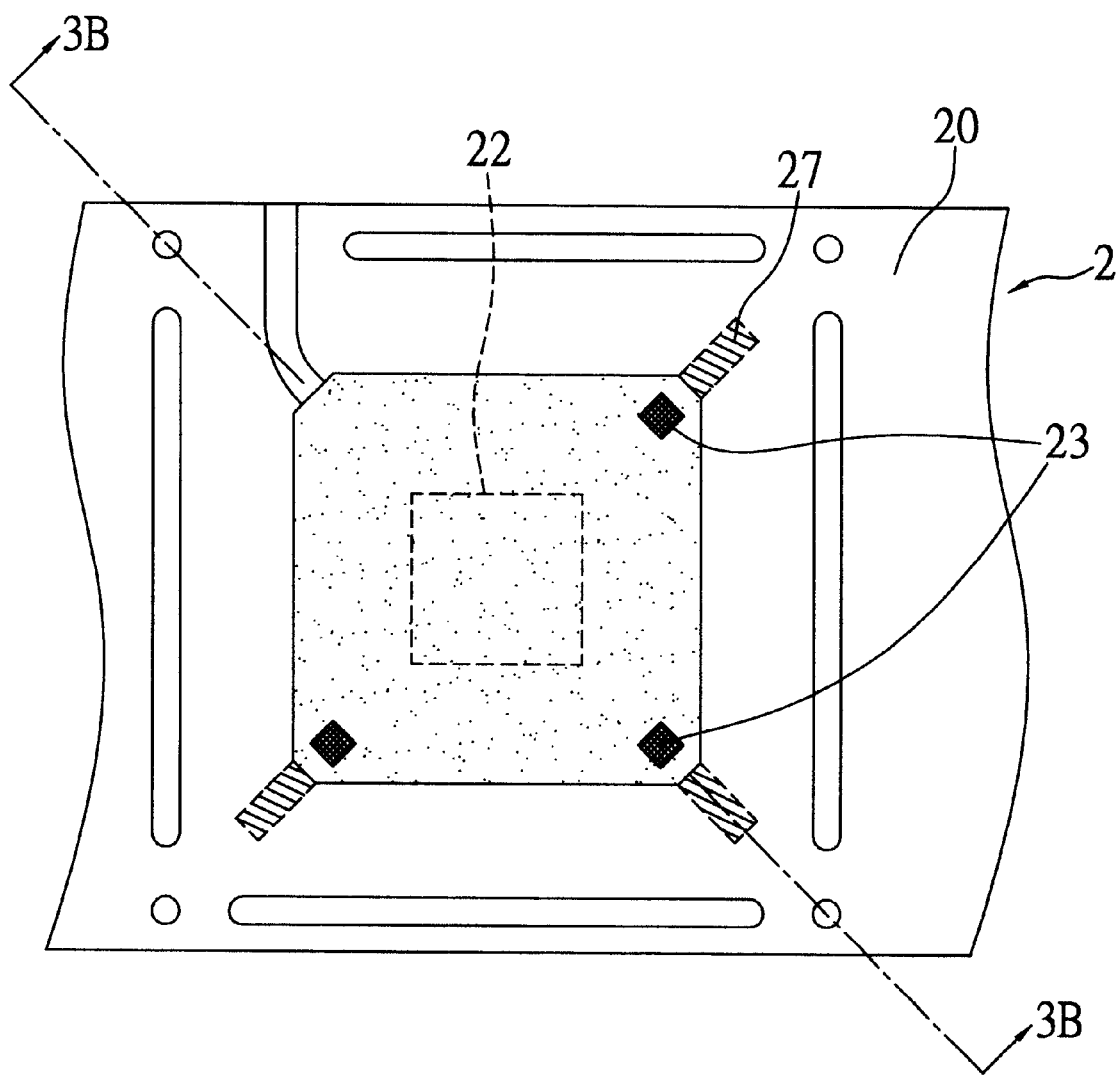
FIG. 3A is top view of a first preferred embodiment of the semiconductor package of the invention.
Figure 3B:
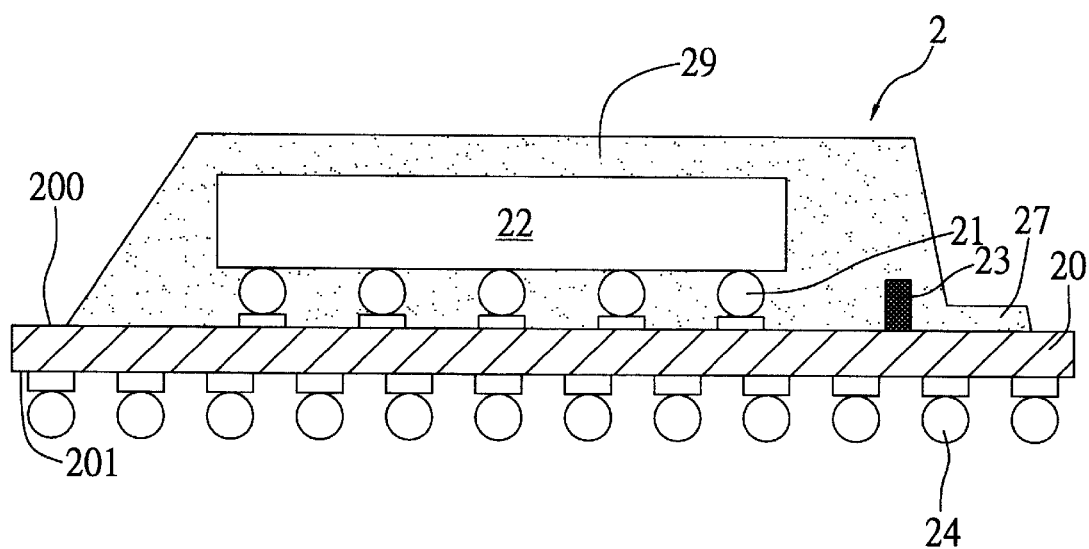
FIG. 3B is a sectional view of a first preferred embodiment of the semiconductor package of the invention.

Illustrated in FIGS. 3A and 313 are respectively a top view and a sectional view of the FCBGA semiconductor package 2 in the first embodiment of the invention. As shown in the drawing, the FCBGA semiconductor package 2 includes a substrate 20, a semiconductor chip 22 mounted on the substrate 20 in a reflow manner by a plurality of solder bumps 21, a plurality of flash preventing mechanisms 23 disposed on the substrate 20 corresponding in position to front ends of air vents 27 of a mold (not shown), a plurality of solder balls 24 implanted on a back side 201 of the substrate 20 for electrically connecting the chip 22 to an external device, and an encapsulant 29 for encapsulating the chip 22 and the flash preventing mechanisms 23.

Illustrated in FIGS. 4A–4E are the steps involved in fabricating the semiconductor package of the invention.

Figure 4A:
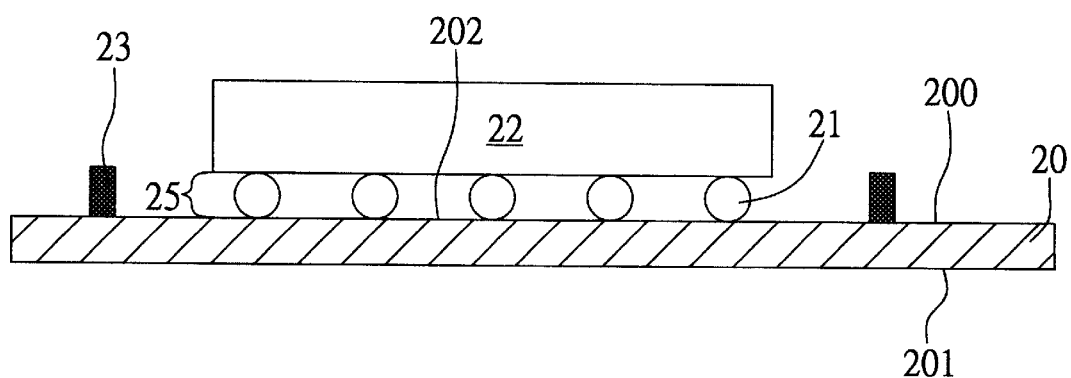
FIGS. 4A–4E are schematic diagrams showing the steps involved in fabricating the semiconductor package of the invention.
Figure 4B:
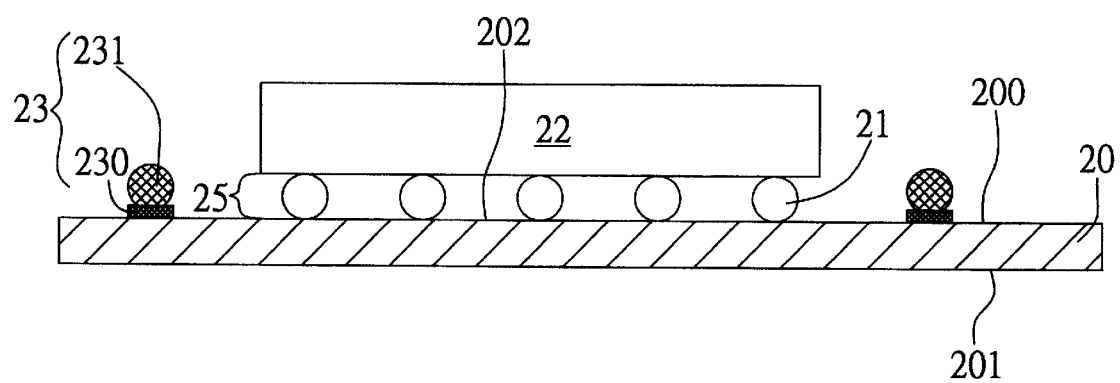

Referring first to FIG. 4A, a substrate 20 having a front side 200 and a back side 201 is prepared, wherein the front side 200 is preformed with a chip bonding region 202. On the front side 200 of the substrate 20 around the chip bonding region 202 there are formed a plurality of flash preventing mechanisms 23 corresponding in position to front ends of air vents of a mold (not shown), while the flash preventing mechanisms 23 can be blocks made of an adhesive, passive elements such as capacitors, resisters or other electronic elements, or a plurality of solder balls 231 and ball pads 230, in a manner that the solder balls 231 are implanted on the ball pads 230 formed at predetermined positions on the front side 200 of the substrate 20, as shown in FIG. 4B. The solder balls 231 can be made of gold or copper.

Further in FIG. 4A, at least one semiconductor chip 22 is bonded to the chip bonding region 202 on the substrate 20 in a flip chip manner by a plurality of solder bumps 21, while a plurality of solder pads (not shown) are formed on the back side 201 of the substrate 20 for subsequently implanting a plurality of solder balls (not shown) on the solder pads. In this case, the solder bumps 21 for mounting the chip 22 on the substrate 20 are disposed in a manner that a cavity 25 is formed between the chip 22 and the substrate 20, and accordingly a flip chip underfill process is necessarily performed for enhancing joint strength between the solder bumps 21 and the substrate 20.

Figure 4C:
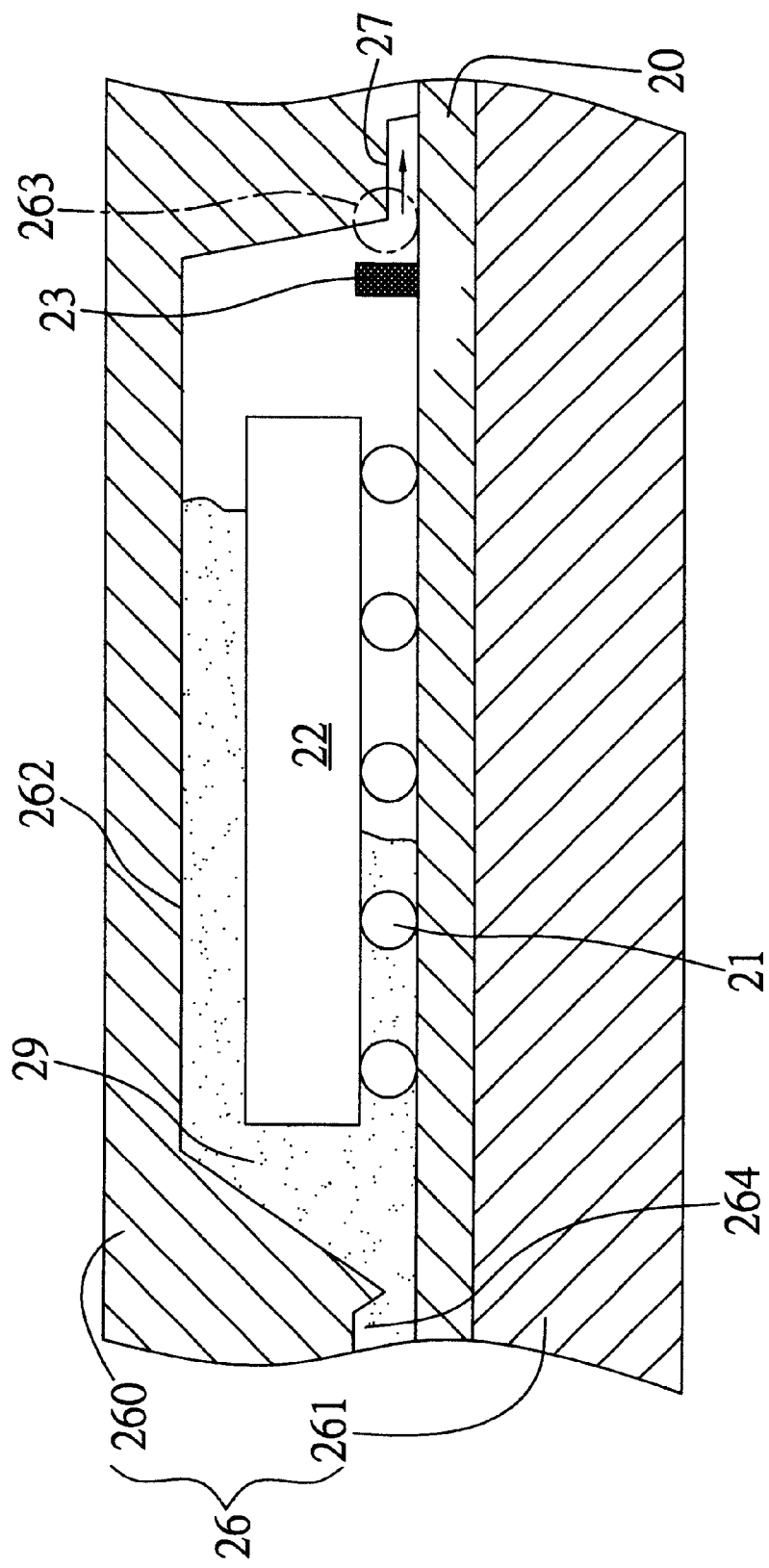
Figure 4D:
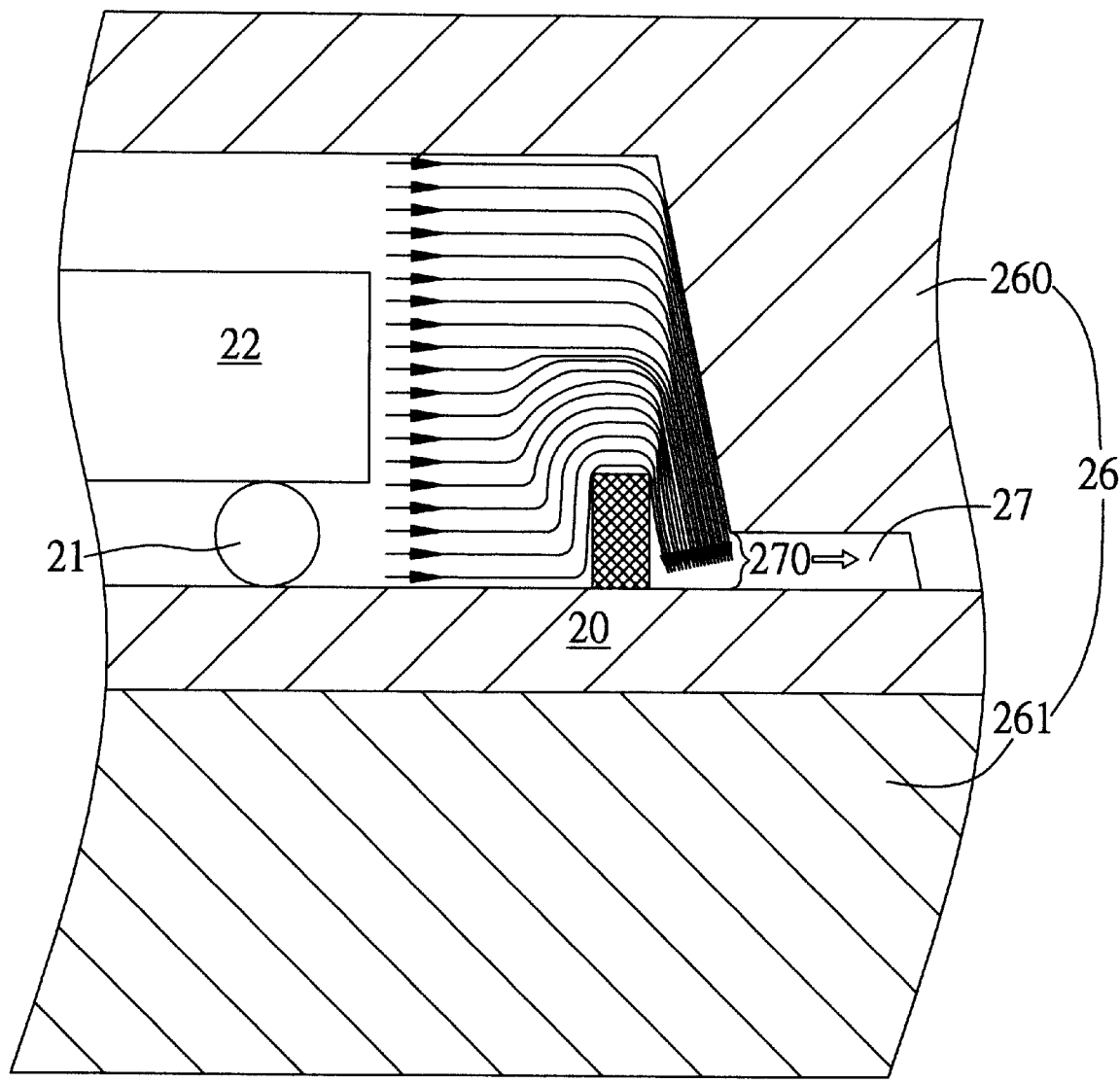

In the invention, a molded underfill technology is employed, in which formation of an encapsulant 29 and the flip chip underfill process are simultaneously performed in a molding process. Referring to FIG. 4C, the substrate 20 having the chip 22 and the flash preventing mechanisms 23 disposed thereon is placed in a mold 26, which includes an upper mold 260 having a mold cavity 262 for receiving the chip 22, and a lower mold 261 engaged with the upper mold 260. In the mold cavity 262 proximal to corner positions 263 thereof there are formed an injection runner 264 and a plurality of air vents 27 connected to the outside for allowing air in the mold cavity 262 to escape during injecting a molding compound 29 (designated by the same reference numeral as the encapsulant 29). Since the above mentioned is conventional in the art, it will not be further detailed herein. However, it is to be noted that in the invention, at least one flash preventing mechanism 23 for impeding a molding flow of the molding compound 29 is disposed at the front end of each air vent 27 around the corner positions 263 of the mold cavity 262 during molding.

Further in FIG. 4C, in order to shorten the filling and baking time for the flip chip underfill process, the encapsulant 29 for encapsulating the chip 22 is formed of the molding compound 29 such as epoxy resin having high fluidity and fine filler size. When the molding compound 29 flows to the corner positions 263 of the mold cavity 262, the molding flow of the molding compound 29 (indicated as an arrow in FIG. 4D) is slowed down at entries 270 of the air vents 27 due to decrease in space at the entries 270 by the construction of the flash preventing mechanisms 23. This facilitates the molding compound 29 to rapidly absorb heat of the mold 26 for increasing the viscosity thereof, so as to prevent the molding compound 29 from flashing out of the air vents 27.

Figure 4E:
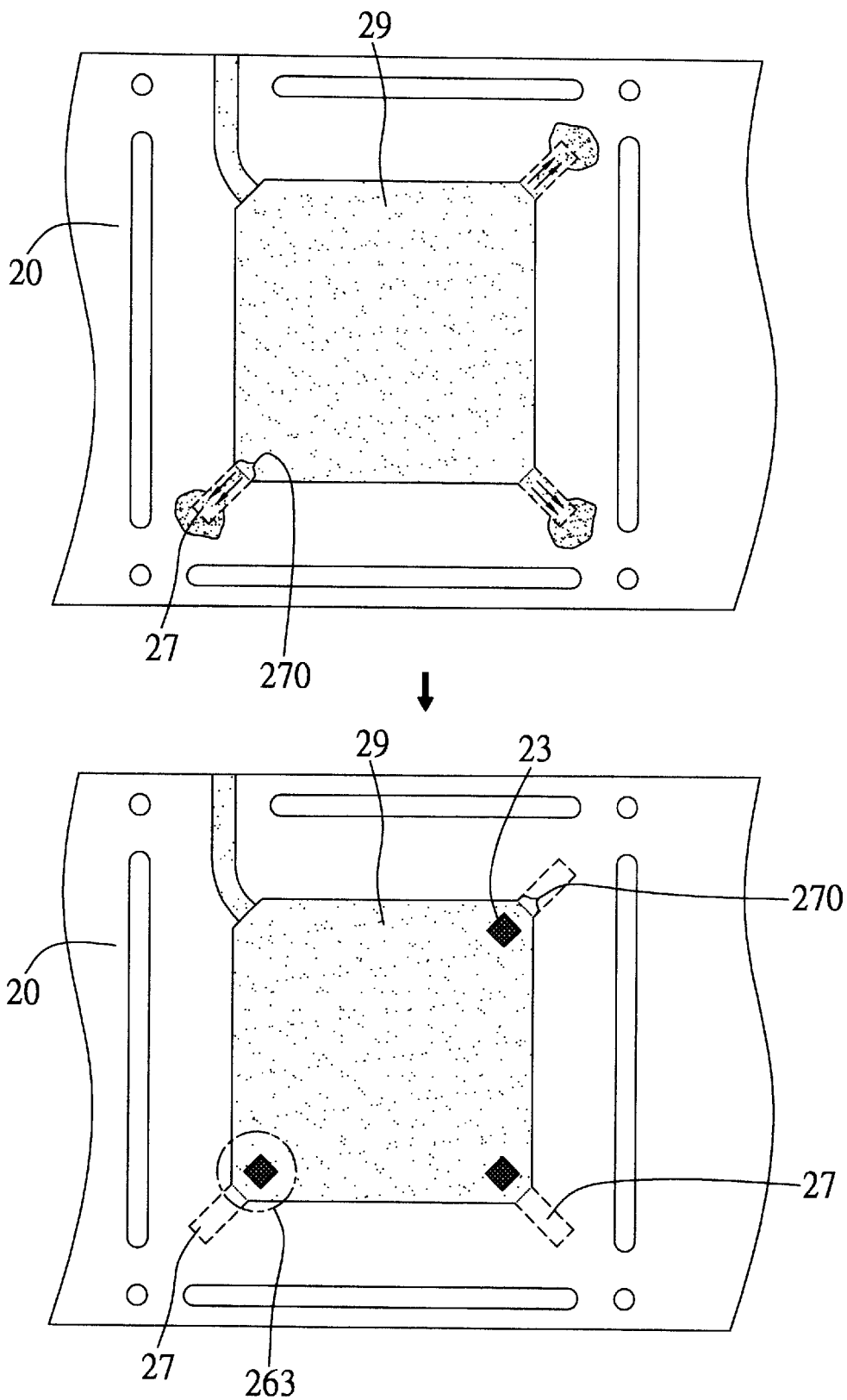

Referring final to FIG. 4E, it illustrates that the molding compound 29 flashes as no flash preventing mechanism 23 is constructed, and the molding compound 29 is prevented from flashing after the flash preventing mechanisms 23 are disposed, respectively. As shown in the drawing, prior to forming the flash preventing mechanisms 23 at the entries 270 of the air vents 27, the molding compound 29 can freely flow to the air vents 27 and easily flash on the substrate 20. However, as the entries 270 are reduced in space due to the construction of the flash preventing mechanisms 23, the flow rate of the molding compound 29 is accordingly reduced at the entries 270. This therefore can prevent the molding compound 29 from flashing on the back side 201 of the substrate 20, and accordingly the solder pads formed on the back side 201 can be free of contamination from flash, so as to assure the bonding quality of the solder balls to the solder pads and the profile of the semiconductor package.

Second Preferred Embodiment

Figure 5:
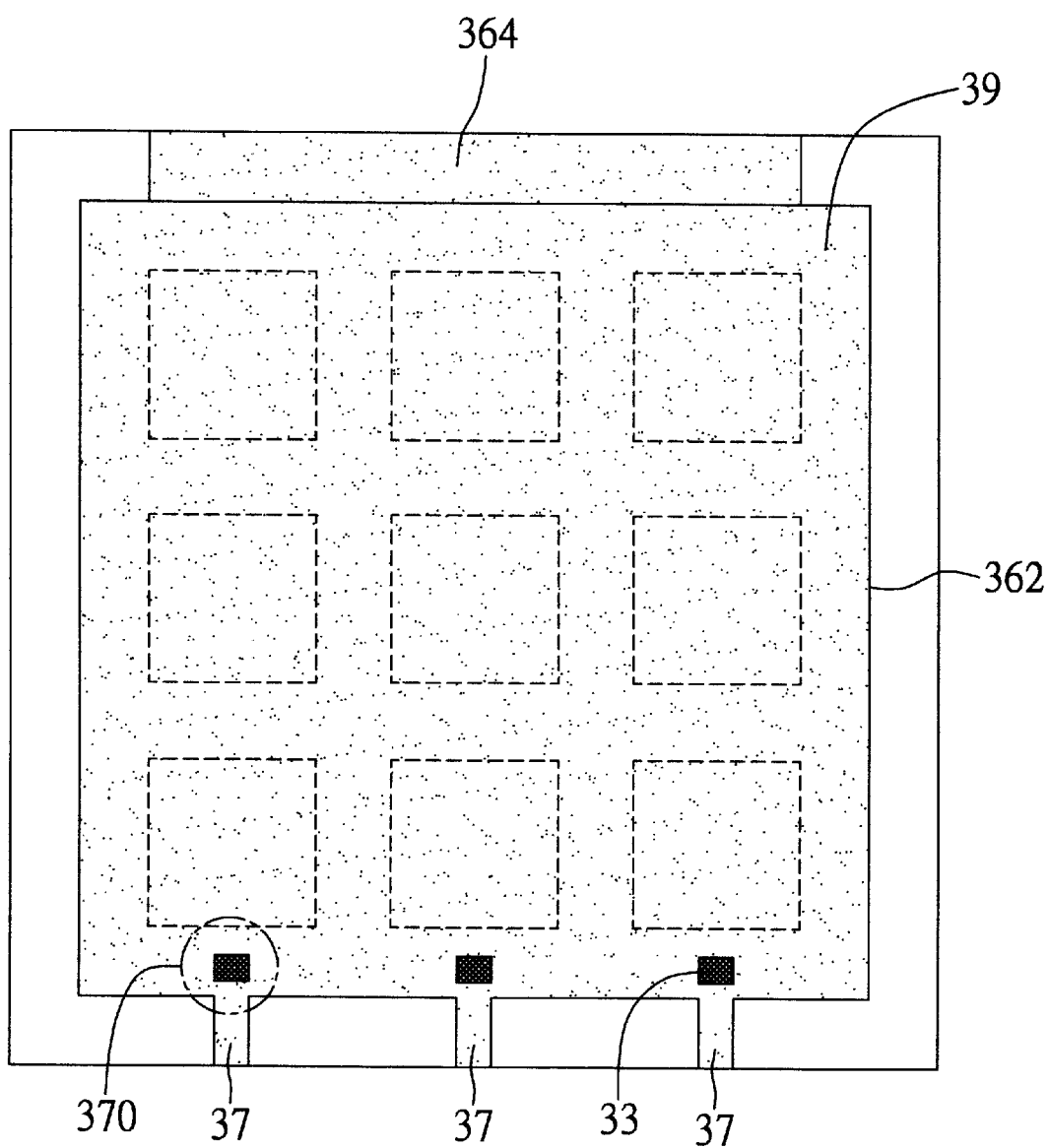
FIG. 5 is a top view showing a molding process for the semiconductor package of the invention.

Illustrated in FIG. 5 is the second embodiment of the semiconductor package of the invention. As shown in the drawing, this embodiment is substantially identical to the first embodiment, with the only difference in that a TFFCBGA (thin and fine flip chip ball grid array) semiconductor package is exemplified in this embodiment. In the TFFCBGA semiconductor package, a molded underfill technology is implemented in a longitudinal molding manner, that is, a plurality of air vents 37 are disposed at one end of a mold cavity 362 opposing to a position where an injection runner 364 is formed, in which at an entry 370 of each air vent 37 there is also formed a flash preventing mechanism 33. In this case, the air vents 37 are disposed approximately in parallel to a flowing direction of a molding compound 39, and therefore the flash preventing mechanisms 33 are necessarily formed in front of the air vents 37, so as to reduce the flow rate of the molding compound 39 and prevent flash of the molding compound 39 from occurrence accordingly.

Third Preferred Embodiment

Figure 6:
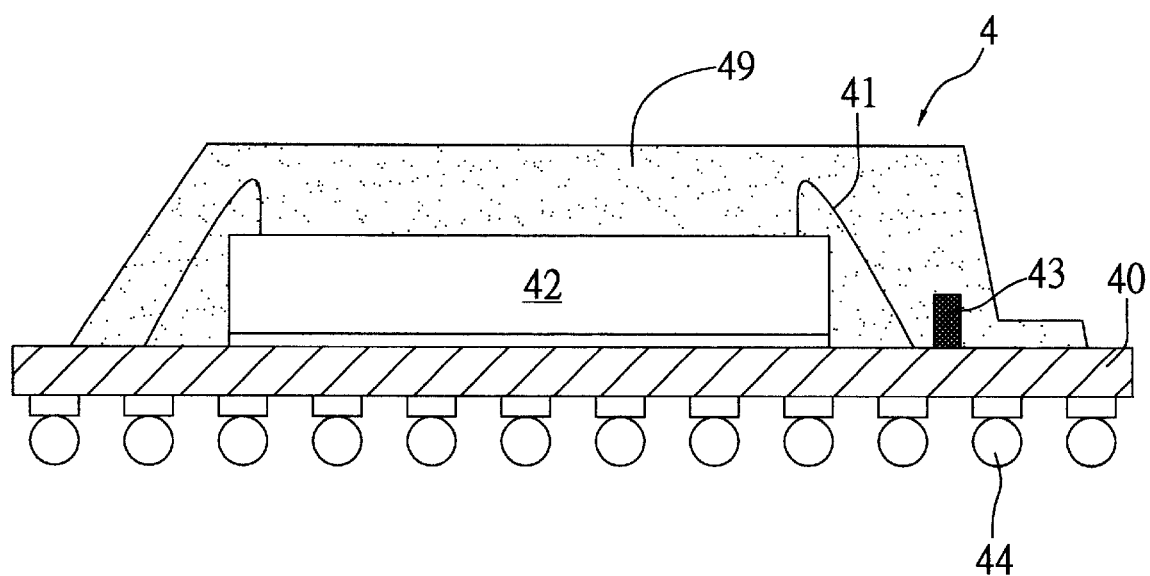
FIG. 6 is a sectional view of another preferred embodiment of the semiconductor package of the invention.

Except a molded underfill technology, the fabricating method of the semiconductor package of the invention can also be applied to a general wire-bonding type BGA semiconductor package 4. Referring to FIG. 6, the semiconductor package 4 employs a flash preventing mechanism 43 for preventing flash of a molding compound 49 from occurrence, as well as reducing the flow rate of the molding compound 49, so as to decrease the impact from injection of the molding compound 49 to bonding wires 41 and the occurrence of dislocation for the bonding wires 41 due to the injection impact, and accordingly more various materials can be used as the molding compound 49.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a flash preventing mechanism, comprising:
   a substrate having at least one flash preventing mechanism disposed on a surface of the substrate corresponding to a position in front of an entry of a groove in a mold;
   at least one semiconductor chip mounted on the substrate and electrically connected to the substrate; and
   an encapsulant formed by a molding compound injected into the mold for encapsulating the semiconductor chip and the flash preventing mechanism;
   wherein the flash preventing mechanism reduces a flow rate of the molding compound at the entry of the groove, so as to prevent the molding compound from flashing into the groove.

2. The semiconductor package of claim 1, wherein the semiconductor package is a BGA (ball grid array) semiconductor package.

3. The semiconductor package of claim 1, wherein the semiconductor package is a FCBGA (flip chip ball grid array) semiconductor package.

4. The semiconductor package of claim 1, wherein the groove is an air vent.

5. The semiconductor package of claim 1, wherein the flash preventing mechanism is a block made of an adhesive, or a passive element such as a capacitor or a resister.

6. The semiconductor package of claim 1, wherein the flash preventing mechanism includes a solder pad formed on the surface of the substrate and a solder ball implanted on the solder pad.

7. The semiconductor package of claim 1, wherein the encapsulant is formed of a molding compound having high fluidity and fine particles of a solid filler.

8. The semiconductor package of claim 7, wherein the particles of the solid filler are much smaller in diameter than a height of the entry of the groove.

9. A fabricating method of a semiconductor package with a flash preventing mechanism, comprising the steps of:
   preparing a substrate having at least one flash preventing mechanism disposed on a surface of the substrate corresponding to a position in front of an entry of a groove in a mold;
   mounting at least one semiconductor chip on the substrate and electrically connecting the semiconductor chip to the substrate; and
   forming an encapsulant formed by a molding compound injected into the mold for encapsulating the semiconductor chip and the flash preventing mechanism;
   wherein the flash preventing mechanism reduces a flow rate of the molding compound at the entry of the groove, so as to prevent the molding compound from flashing into the groove.

10. The fabricating method of claim 9, wherein the semiconductor package is a BGA (ball grid array) semiconductor package.

11. The fabricating method of claim 9, wherein the semiconductor package is a FCBGA (flip chip ball grid array) semiconductor package.

12. The fabricating method of claim 9, wherein the groove is an air vent.

13. The fabricating method of claim 9, wherein the flash preventing mechanism is a block made of an adhesive, or a passive element such as a capacitor or a resister.

14. The fabricating method of claim 9, wherein the flash preventing mechanism includes a solder pad formed on the surface of the substrate and a solder ball implanted on the solder pad.

15. The fabricating method of claim 9, wherein the encapsulant is formed of a molding compound having high fluidity and fine particles of a solid filler.

16. The fabricating method of claim 15, wherein the particles of the solid filler are much smaller in diameter than a height of the entry of the groove.

* * * * *